United States Patent
Bae et al.

(10) Patent No.: US 11,373,781 B2
(45) Date of Patent: Jun. 28, 2022

(54) FLEXIBLE CABLE

(71) Applicant: Samsung Electronics Co., Ltd., Gyeonggi-do (KR)

(72) Inventors: Bumhee Bae, Gyeonggi-do (KR); Minseok Kim, Gyeonggi-do (KR); Younho Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/930,551

(22) Filed: Jul. 16, 2020

(65) Prior Publication Data

US 2021/0020329 A1 Jan. 21, 2021

(30) Foreign Application Priority Data

Jul. 18, 2019 (KR) .................. 10-2019-0087220

(51) Int. Cl.
*H01B 7/08* (2006.01)
*H01B 7/04* (2006.01)

(52) U.S. Cl.
CPC ............. *H01B 7/0838* (2013.01); *H01B 7/04* (2013.01); *H01B 7/0861* (2013.01)

(58) Field of Classification Search
CPC ...... H01B 7/0838; H01B 7/04; H01B 7/0861; H01B 11/1878; H01B 11/12; H05K 1/028; H05K 1/189; H05K 1/0346; H05K 2201/0154; H05K 2201/10143; H05K 2201/09281; H05K 2201/09227; H05K 2201/10037; H05K 1/0393; H05K 2201/09263; H02S 40/38; Y02E 70/30; Y02E 10/50; H01L 31/042

See application file for complete search history.

(56) References Cited

U.S. PATENT DOCUMENTS

| | | | | |
|---|---|---|---|---|
| 5,844,783 | A | * | 12/1998 | Kojima ................ H05K 1/0228 361/777 |
| 8,759,687 | B2 | | 6/2014 | Naganuma et al. |
| 10,299,375 | B2 | * | 5/2019 | Kim ...................... H05K 1/115 |
| 2002/0157865 | A1 | * | 10/2002 | Noda ................... H05K 1/0224 174/261 |
| 2007/0193770 | A1 | | 8/2007 | Ueno et al. |
| 2007/0289704 | A1 | | 12/2007 | Takano et al. |

(Continued)

FOREIGN PATENT DOCUMENTS

KR 10-2007-0038025 A 4/2007
KR 10-2018-0019472 A 2/2018

(Continued)

OTHER PUBLICATIONS

English Translation KR2018080613, Gigalane Co Ltd (Year: 2018).*
International Search Report dated Oct. 22, 2020.

*Primary Examiner* — Steven T Sawyer
(74) *Attorney, Agent, or Firm* — Cha & Reiter, LLC

(57) ABSTRACT

In accordance with an aspect of the disclosure, a cable comprises a flexible cable portion; and an end cable portion connected to one end of the flexible cable portion, wherein the flexible cable portion comprises: a first wire comprising one or more signal transmission lines; and a second wire comprising one or more fill-cut areas corresponding to the signal transmission lines and at least one or more ground lines.

22 Claims, 9 Drawing Sheets

(56) References Cited

U.S. PATENT DOCUMENTS

| | | | |
|---|---|---|---|
| 2008/0236868 A1* | 10/2008 | Koga | H01R 12/594 |
| | | | 174/117 F |
| 2011/0232938 A1* | 9/2011 | Kodama | H01B 7/0838 |
| | | | 174/117 F |
| 2012/0020416 A1* | 1/2012 | Shimura | H04B 3/02 |
| | | | 375/257 |
| 2014/0168926 A1 | 6/2014 | Colman | |
| 2016/0247595 A1 | 8/2016 | Song et al. | |
| 2017/0200529 A1 | 7/2017 | Neumann et al. | |
| 2018/0053981 A1 | 2/2018 | Bae et al. | |
| 2019/0045630 A1* | 2/2019 | Kim | H05K 3/46 |

FOREIGN PATENT DOCUMENTS

| | | |
|---|---|---|
| KR | 10-2018-0080613 A | 7/2018 |
| KR | 10-2018-0103108 A | 9/2018 |

* cited by examiner

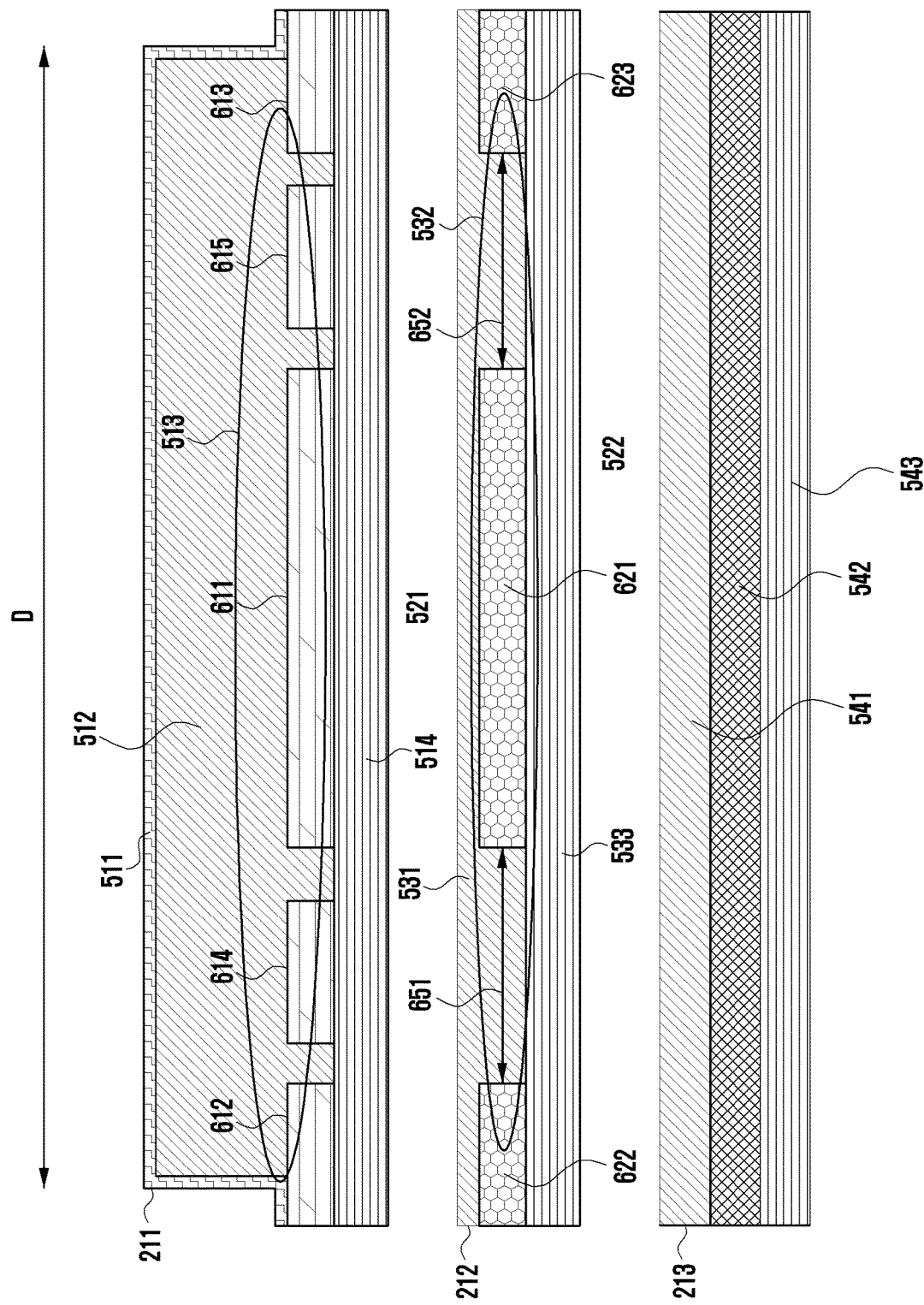

FLEXIBLE CABLE

CROSS-REFERENCE TO RELATED APPLICATION(S)

This application is based on and claims priority under 35 U.S.C. 119 to Korean Patent Application No. 10-2019-0087220, filed on Jul. 18, 2019, in the Korean Intellectual Property Office, the disclosure of which is herein incorporated by reference in its entirety.

BACKGROUND

1) Field

The disclosure relates to a flexible cable that may transmit a radio frequency (RF) signal showing excellent impedance matching.

2) Description of Related Art

Electronic devices such as smartphones, tablet PCs, and computers have become smaller, slimmer, and capable of performing increasing numbers of functions. An electronic device may be used by mounting or connecting various electronic components such as processor(s), memory, speaker(s), microphone(s), sensor(s), camera(s), antenna, and/or communication module(s) on or to a printed circuit board (PCB) through a flexible printed circuit board (FPCB). The PCB or the FPCB may include a cable that connects various electronic components.

The above information is presented as background information only to assist with an understanding of the disclosure. No determination has been made, and no assertion is made, as to whether any of the above might be applicable as prior art with regard to the disclosure.

SUMMARY

In accordance with an aspect of the disclosure, a cable comprises a flexible cable portion; and an end cable portion connected to one end of the flexible cable portion, wherein the flexible cable portion comprises: a first wire comprising one or more signal transmission lines; and a second wire comprising one or more fill-cut areas corresponding to the signal transmission lines and at least one or more ground lines.

BRIEF DESCRIPTION OF THE DRAWINGS

For a more complete understanding of the disclosure and its advantages, reference is now made to the following description taken in conjunction with the accompanying drawings, in which like reference numerals represent like parts:

FIG. 6 is a cross-sectional view of a third cable of FIG. 2 of the disclosure, taken along in a transverse direction D thereof;

DETAILED DESCRIPTION

Figure 1:
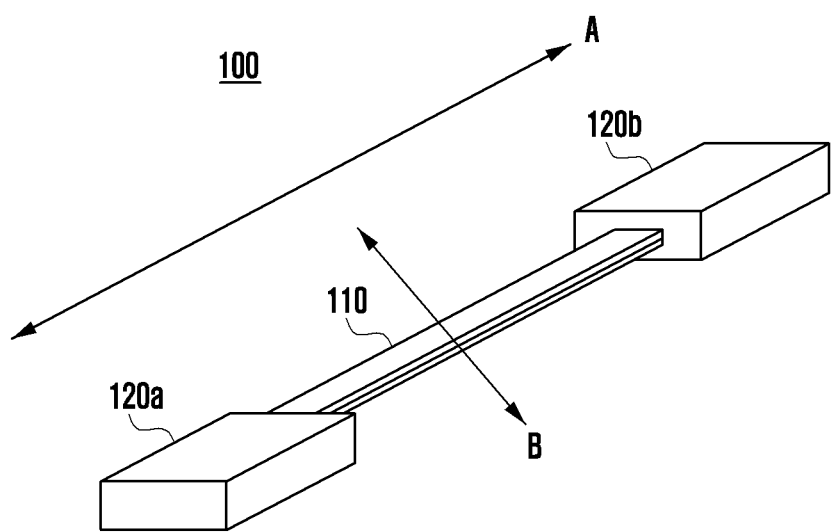
FIG. 1 is a view illustrating a flexible cable according to certain embodiments of the disclosure.

Electronic devices tend to fully employ flexible displays or foldable displays. Accordingly, a cable that connects various components, such as a PCB or an FPCB, which is included in an electronic device also has to have a high flexibility.

Currently, it is difficult to for a very small cable (e.g., a coaxial cable) to transmit an electromagnetic signal with a carrier frequency (now referred to as a "signal") within an electronic device that can be mechanically deformed along the transmission path.

Certain embodiments of the disclosure may provide a flexible cable having high impedance matching while with high flexibility.

In a flexible cable according to certain embodiments of the disclosure, a signal can be transmitted at a high speed without loss or reflection because impedance matching is while the cable is very flexible. Radiation of electromagnetic waves can be effectively reduced because of high impedance matching. The flexible cable according to certain embodiments of the disclosure can be used in a wide variety of electronic devices.

The flexible cable according to certain embodiments of the disclosure can improve the qualities of various electronic devices and reduce assembly costs by transmitting a signal at a high speed without loss and reflection while providing high flexibility characteristics.

It should be appreciated that certain embodiments of the disclosure and the terms used therein are not intended to limit the technological features set forth herein to particular embodiments and include various changes, equivalents, or alternatives for a corresponding embodiment.

With regard to the description of the drawings, similar reference numerals may be used to designate similar or relevant elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order).

FIG. 1 is a view illustrating a cable 100 according to certain embodiments of the disclosure. The cable 100 can be a medium for transmission of a signal from a first electrical component to a second electrical component, by connecting one end of the cable 100 to the first electrical component and the other end of the cable 100 to the second electrical component. It is noted that due to design limitations, and spatial considerations, the cable 100 may not be capable of forming a direct path from the first electrical component to the second electrical component. Moreover, cable 100 may have to be bent, mechanically, to traverse a rather constricted area forming a physical passage between the first electrical component and the second electrical component.

The cable 100 may include a flexible cable portion 110, a first end cable portion 120*a* and a second end cable portion 120*b*. According to certain embodiments, the cable 100 can connect a first electrical component and a second electrical component using a non-straight path. The end cable portions 120 can be relatively straight, while the flexible cable portion 110 is mechanically bent.

The flexible cable portion 110 may include at least two cable strands. The flexible cable portion 110 may include two cords, cables, or wires. The first end cable portion 120 and the second end cable portion 120 may be electrically connected to opposite ends of the flexible cable portion 110, including the at least two cable strands. The at least two cable strands included in the flexible cable portion 110 may be spaced apart from each other, and an air gap may be provided between the two cable strands due to the second cable connected to the opposite ends thereof.

The flexible cable portion 110 has a flexibility that is higher than that of the end cable portions 120. The signal loss and the reflection of the end cable portions 120 may become lower than those of the flexible cable portion 110 when a signal (e.g., a radio frequency (RF) signal) is transmitted.

According to certain embodiments, the flexible cable portion 110 corresponds to a high flexibility section 110 of the cable 100, and the end cable portions 120 may correspond to a low loss sections of the flexible cable portion 110.

Figure 2:
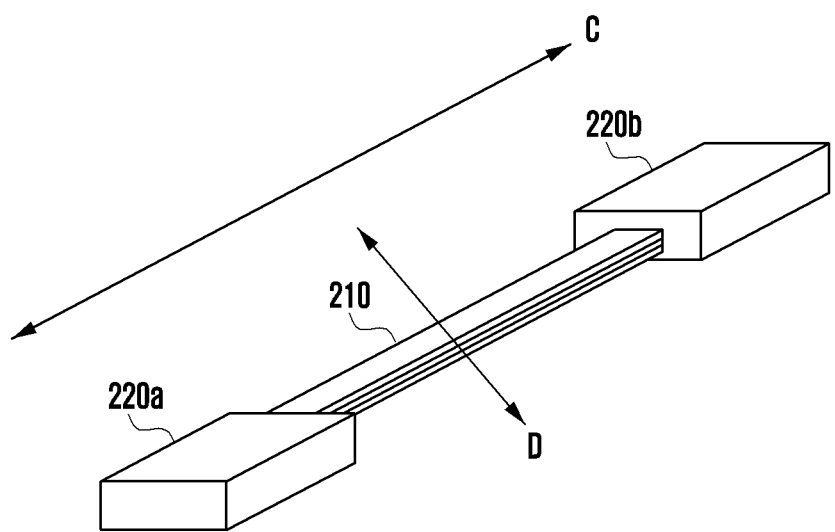
FIG. 2 is a view illustrating a flexible cable according to certain embodiments of the disclosure.

FIG. 2 is a perspective view illustrating a cable 200 according to certain embodiments of the disclosure.

The flexible cable 200 may include a flexible cable portion 210 and a first end cable portion 220*a* and a second end cable portion 220*b*.

The flexible cable portion 210 may include at least three or more cable strands. The cable 200 of FIG. 2 may include at least three or more cable strands in the flexible cable portion 210 as compared with the cable 100 of FIG. 1.

Figure 3:
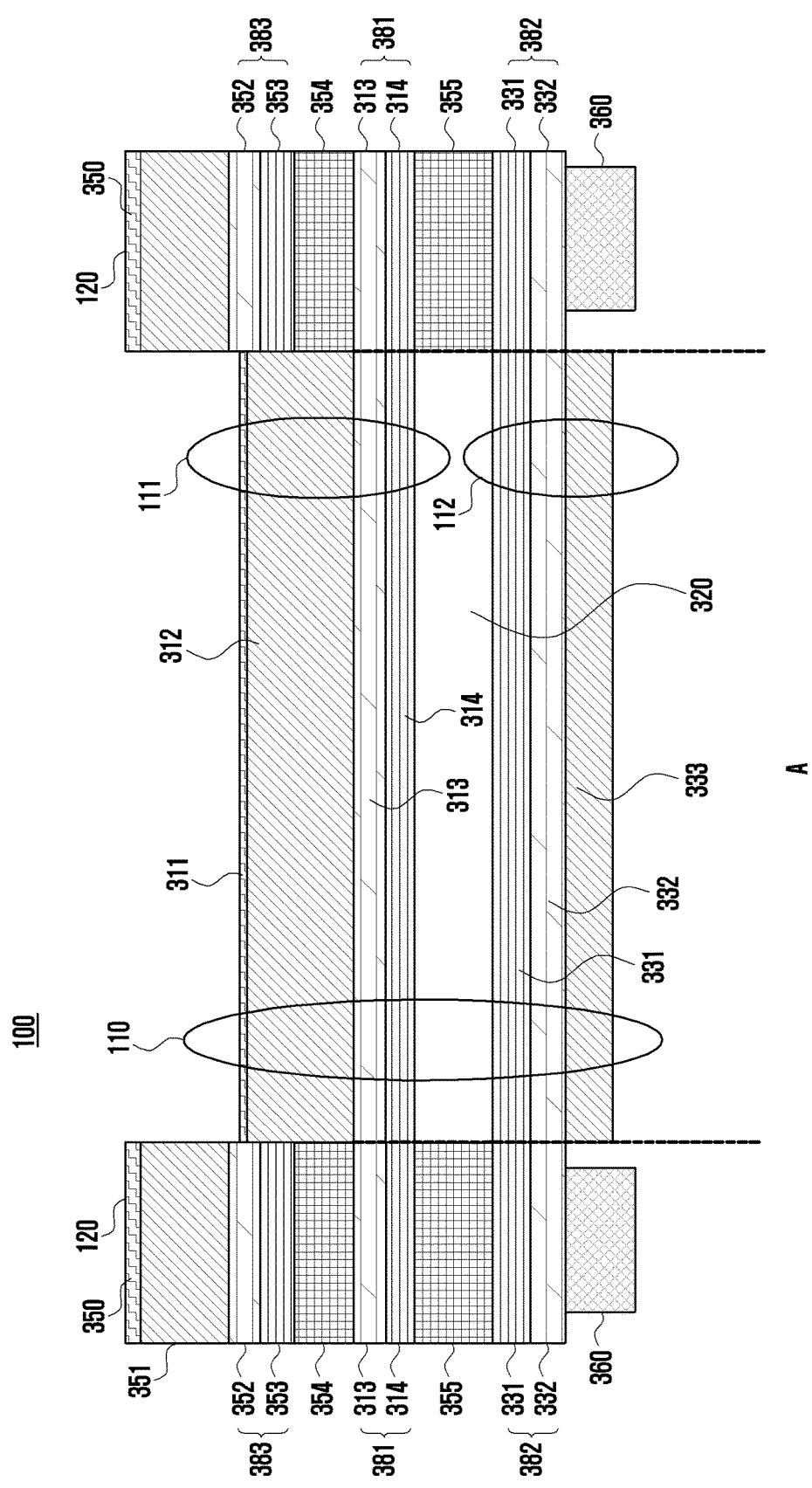
FIG. 3 is a cross-sectional view of the flexible cable of FIG. 1 of the disclosure, taken along in a lengthwise direction A thereof.

FIG. 3 is a cross-sectional view of the flexible cable of FIG. 1 of the disclosure, taken along in a lengthwise direction A thereof. The cable 100 includes two metal foil layers 313 and 332 that have high electrical conductivity. The metal foil layers can be cut along the direction A to result in a number of different electrical connection paths. The metal foil layers 313 and 332 are insulated by insulation layers 312 and 333, and metal foil insulation layers 314 and 331. The insulation layer, metal foil layer, and metal foil insulation layers 312/313/314, 331/332/333 form a first wire 111 and a second wire 112. The first wire 111 and the second wire 112 can be separated by an air gap 320, with the metal foil insulation layers 314 and 331 disposed towards each other, within the flexible cable portion 110.

The width of the air gap 320 can be changed when the first wire 111 and the second wire 112 move relative to one another, such as when the flexible cable portion 110 is mechanically bent. When the width of the air gap 320 is changed, impedance matching of the cable 100, the flexible cable portion 110, the first wire 111, and the second wire 112 is maintained and the loss and the reflection of a signal is low.

The cable 100 may include a first wire 111 and a second wire 112. The cable 100 may further include an air gap between the first wire 111 and the second wire 112.

The first wire 111 may include a first shield layer 311, a first insulation layer 312, and a metal foil clad laminate 381.

The first shield layer 311 may be a film that may shield electron magnetic interferences (EMIs). For example, the first shield layer 311 may include an electron magnetic interference (EMI) shielding film. For example, the first shield layer 311 may include polyester or polyimide. The first shield layer 311 may be provided on a surface of the first wire 111, and the first shield layer 311 may provide a ground to the first metal foil layer 313. The first insulation layer 312 may be provided at a lower portion of the first shield layer 311.

The first insulation layer 312 may include a material having an insulation property. The first insulation layer 312 may include a dielectric. The first insulation layer 312 may include a cover layer. The first insulation layer 312 may protect and insulate an exposed surface of a circuit of the metal foil clad laminate 381. The first insulation layer 312 may be disposed between the first shield layer 311 and the first metal foil layer 313. The first insulation layer 312 may be disposed between the first shield layer 311 and the metal foil clad laminate 381.

The metal foil clad laminate 381 may include a first metal foil layer 313 and a first metal foil insulation layer 314. The first metal foil layer 313 may include at least one or more signal transmission lines and at least one or more ground lines. The metal foil clad laminate 381, for example, may include a copper clad laminate (CCL). The metal foil clad laminate 381 may be a structure in which a metal foil (e.g., a copper foil) is disposed on one surface thereof and an insulation layer is disposed and laminated on a second surface thereof. The metal foil clad laminate 381 may be disposed under the first insulation layer 312, and may be disposed between the insulation layer 312 and the air gap 320.

The first metal foil layer 313 may be disposed between the first insulation layer 312 and the first metal foil insulation layer 314. The first metal foil layer 313 may be configured to include at least one or more signal transmission lines and at least one or more ground lines by etching or machining (e.g., numerical-control machining) at least a portion of the metal foil clad laminate 381.

The first metal foil insulation layer 314 may constitute at least a portion of the metal foil clad laminate 381, and may include a material having an insulation property. The first metal foil insulation layer 314 may include a dielectric. The first metal foil insulation layer 314 may deliver a signal radiated from the first metal foil layer 313 to the second wire 112 through the air gap 320.

The width of the air gap 320 between the first wire 111 and the second wire 112 may change when the first wire 111 and the second wire 112 move with respect to each other, such as when flexible cable portion 110 is mechanically bent. When the width of the air gap 320 is changed, impedance matching of the cable 100, the flexible cable portion 110, the first wire 111, and the second wire 112 is maintained and the loss and the reflection of a signal is low and the reflection of a signal may be constantly maintained.

The first shield layer 311, the first insulation layer 312, the metal foil clad laminate 381 may be joined to each other through heating and/or pressing to form the first wire 111. For example, the first shield layer 311, the first insulation layer 312, and the metal foil clad laminate 381 may be joined to each other by using a heat press.

The second wire 112 may include a second metal foil clad laminate 382 and a second insulation layer 333.

The second metal foil clad laminate 382 may include a second metal foil insulation layer 331 and a second metal foil layer 332. The second metal foil layer 332 may include at least one or more fill-cut areas and at least one or more ground lines. The second metal foil clad laminate 382, for example, may include a copper clad laminate (CCL). The second metal foil clad laminate 382 may be a structure in which a metal foil (e.g., a copper foil) is disposed on one surface thereof and an insulation layer is disposed and laminated on a second surface thereof. The second metal foil clad laminate 382 may be disposed under the air gap 320, and may be disposed between the air gap 320 and the second insulation layer 333.

The second metal foil insulation layer 331 may constitute at least a portion of the second metal foil clad laminate 382, and may include a material having an insulation property. The second metal foil insulation layer 331 may include a dielectric. The second metal foil insulation layer 331 may deliver a signal radiated from the first metal foil layer 313 to the second metal foil layer 332.

The second metal foil layer 332 may be disposed between the second insulation layer 333 and the second metal foil insulation layer 331. The second metal foil layer 332 may be configured to include at least one or more signal transmission lines and at least one or more ground lines by etching or machining (e.g., numerical-control machining) at least a portion of the second metal foil clad laminate 382.

The second metal foil clad laminate 382 and the second insulation layer 333 may be joined to each other through heat and/or pressing to form the second wire 112. For example, the second metal foil clad laminate 382 and a second insulation layer 333 may be joined to each other by using a heat press.

The second insulation layer 333 may include a material having an insulation property. The second insulation layer 333 may include a dielectric. The second insulation layer 333 may include a cover layer. The second insulation layer 333 may protect and insulate an exposed surface of a circuit of the second metal foil clad laminate 382. The second insulation layer 333 and the second metal foil insulation layer 331 may be exposed to the outside to protect the second metal foil layer 332 from the outside. Opposite ends of the metal foil clad laminate 381 and the second metal foil clad laminate 382 included in the first cable 110 may be continuously connected to the end cable portions 120.

The end cable portions 120 may be connected to opposite ends of the flexible cable portion 110. The first cable may include a second shield layer 350, a third insulation layer 351, a third metal foil clad laminate 383, a first coupling layer 354, a first metal foil clad laminate 381, a second coupling layer 355, a second metal foil clad laminate 382, and a connector 360.

The first metal foil clad laminate 381 and the second metal foil laminate 382 included in the end cable portions 120 may be continuously connected to the flexible cable portion 110. The metal foil clad laminate 381 and the second metal foil clad laminate 382 of the end cable portions 120 may be the same as the first metal foil clad laminate 381 and the second metal foil clad laminate 382 of the flexible cable portion 110.

The second shield layer 350 may be a film that may shield electron magnetic interferences (EMIs). For example, the second shield layer 350 may include an electron magnetic interference (EMI) shielding film. For example, the second shield layer 350 may include polyester or polyimide. The second shield layer 350 may be provided on a surface of the end cable portions 120. The second insulation layer 350 may be provided at a lower portion of the second shield layer 350.

The third insulation layer 351 may include a material having an insulation property. The third insulation layer 351 may include a dielectric. The third insulation layer 351 may include a cover layer. The third insulation layer 351 may protect and insulate an exposed surface of a circuit of the third metal foil clad laminate 383. The second insulation layer 351 may be disposed between the second shield layer 350 and the third metal foil layer 352. The third insulation layer 351 may be disposed between the second shield layer 350 and the third metal foil clad laminate 383.

The third metal foil clad laminate 383 may include a third metal foil layer 352 and a third metal foil insulation layer 353. The third metal foil layer 352 may include at least one or more signal transmission lines and/or at least one or more ground lines. The third metal foil clad laminate 383, for example, may include a copper clad laminate (CCL). The third metal foil clad laminate 383 may be a structure in which a metal foil (e.g., a copper foil) is disposed on one surface thereof and an insulation layer is disposed and laminated on a second surface thereof. The third metal foil clad laminate 383 may be disposed under the third insulation layer 351, and may be disposed between the third insulation layer 351 and the first coupling layer 354.

The third metal foil layer 352 may be disposed between the third insulation layer 351 and the third metal foil insulation layer 353. The third metal foil layer 352 may be configured to include at least one or more signal transmission lines and/or at least one or more ground lines by etching or machining (e.g., numerical-control machining) at least a portion of the third metal foil clad laminate 383.

The first coupling layer 354 may be disposed between the third metal foil clad laminate 383 and the metal foil clad laminate 381.

The metal foil clad laminate 381 may be disposed between the first coupling layer 354 and the second coupling layer 355.

The first coupling layer 354 and the second coupling layer 355 may include a prepreg (pre-impregnated material) or a bonding sheet.

The first coupling layer 354 and the second coupling layer 355 may allow the metal foil clad laminate 381 to be coupled to and laminated on the third metal foil clad laminate 383 or the second metal foil clad laminate 382.

The first coupling layer 354 and the second coupling layer 355 may include an insulation material. The first coupling layer 354 and the second coupling layer 355 may shield a signal transmission line (the first signal transmission line 414 or the second signal transmission line 415 of FIG. 4) included in the metal foil clad laminate 381. When a signal is transmitted through the metal foil clad laminate 381, the first coupling layer 354 and the second coupling layer 355 may reduce signal loss and reflection of the metal foil clad laminate 381 by shielding the metal foil clad laminate 381.

The connector 360 may be disposed under the second metal foil clad laminate 382. The connector 360 may be coupled to the second metal foil layer 332 to provide a ground.

The connector 360 may be coupled to a ground to provide a ground voltage to the flexible cable 100.

Figure 4:
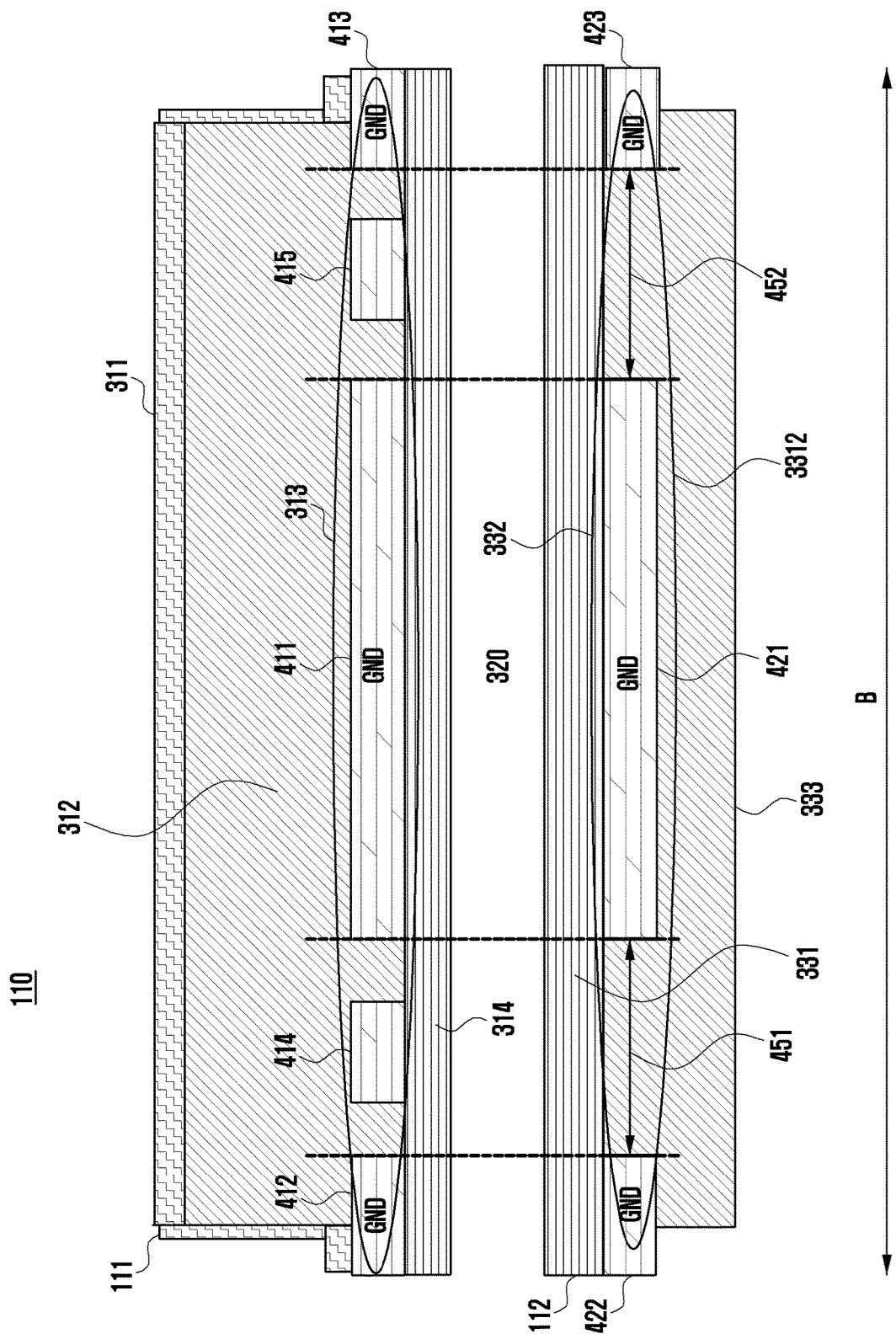
FIG. 4 is a cross-sectional view of a first cable of FIG. 1 of the disclosure, taken along in a transverse direction B thereof.

FIG. 4 is a cross-sectional view of a flexible cable portion 110 of FIG. 1 of the disclosure, taken along in a transverse direction B thereof.

The first metal foil layer 313 can be cut out into signal lines 411-415, while the second metal foil layer 332 can be cut into signal lines 421, 422, and 423.

The cable 100 may include a first wire 111 and a second wire 112. The cable 100 may further include an air gap 320 between the first wire 111 and the second wire 112.

The first wire 111 may include a first shield layer 311, a first insulation layer 312, and a metal foil clad laminate 381.

The first metal foil layer 313 may be disposed between the first insulation layer 312 and the first metal foil insulation layer 314. The first metal foil layer 313 may include a first signal transmission line 414 and a second signal transmission line 415, a first ground line 411, a second ground line 412, and a third ground line 413. According to certain embodiments, the signal lines 411, 412, 413, 414, and 415 can be used for in a different configuration, where different ones are used as ground lines and different ones are used as transmission lines.

The first insulation line 312 may be disposed on the first metal foil layer 313 in which the first signal transmission line 414 and the second signal transmission line 415, the first ground line 411, the second ground line 412, and the third ground line 413 are disposed, and may protect and insulate the first signal transmission line 414 and the second signal transmission line 415, the first ground line 411, the second ground line 412, and the third ground line 413.

The first ground line 411 may be disposed at the center of the first metal foil layer 313. The first signal transmission line 414 and the second signal transmission line 415 may be disposed to be spaced apart from the first ground line 411 by a predetermined length.

The first signal transmission line 414 and the second signal transmission line 415 may be disposed on opposite sides while being spaced apart from the first ground line 411 by a predetermined length.

The second ground line 412 may be disposed to be spaced apart from the first signal transmission line 414 by a predetermined length. The first insulation layer 312 may be disposed in the spacing area. Then, the first insulation layer 312 may contact the first metal foil insulation layer 314.

The third ground line 413 may be disposed to be spaced apart from the second signal transmission line 415 by a predetermined length. The first insulation layer 312 may be disposed in the spacing area. Then, the first insulation layer 312 may contact the first metal foil insulation layer 314.

The first ground line 411 may be disposed at the center of the first metal foil layer 313, the first signal transmission line 414 and the second signal transmission line 415 may be disposed to be spaced apart from each other on opposite sides of the first ground line 411, and the second ground line 412 and the third ground line 413 may be disposed on sides that are close to the first signal transmission line 414 and the second signal transmission line 415 and/or on sides that are farthest from the first ground line 411.

The first ground line 411 and the second ground line 412 may be spaced apart from each other to correspond to the first fill-cut area 451.

The first ground line 411 and the third ground line 413 may be spaced apart from each other to correspond to the second fill-cut area 452.

The first fill-cut area 451 and the second fill-cut area 452 may be areas obtained by removing a metal foil from at least a partial area of the second metal foil layer 332. It is noted that although the fill-cut areas 451 and 452 can be formed by removing portions of a previously existing metal foil layer 313 or 332, fill-cut areas 451 and 452 can be formed by separated deposition of lines 421, 422, 423.

The first signal transmission line 414 may be disposed at at least a portion of the area in which the first ground line 411 and the second ground line 412 are spaced apart from each other to correspond to the first fill-cut area 451 to be spaced apart from the first ground line 411 and the second ground line 412 by a predetermined distance. The first insulation layer 312 may be disposed in the spacing area. Then, the first insulation layer 312 may contact the first metal foil insulation layer 314.

The second signal transmission line 415 may be disposed at at least a portion of the area in which the first ground line 411 and the third ground line 413 are spaced apart from each other to correspond to the second fill-cut area 452 to be spaced apart from the first ground line 411 and the third ground line 413 by a predetermined distance. The first insulation layer 312 may be disposed in the spacing area. Then, the first insulation layer 312 may contact the first metal foil insulation layer 314.

The first metal foil insulation layer 314 may constitute at least a portion of the metal foil clad laminate 381, and may include a material having an insulation property.

The second wire 112 may include a second metal foil clad laminate 382 and a second insulation layer 333.

The second metal foil clad laminate 382 may include a second metal foil insulation layer 331 and a second metal foil layer 332. The second metal foil layer 332 may include at least one or more fill-cut areas 451 and 452 and at least one or more ground lines 421, 422, and 423.

The second foil layer 332 may include a fourth ground line 421, a fifth ground line 422, and a sixth ground line 423.

The second insulation layer 332 may be disposed on the second metal foil layer 332, on which the fourth line 421, the fifth ground line 422, and the sixth ground line 423 are disposed, and may protect and insulate the fourth ground line 421, the fifth ground line 422, and the sixth ground line 423.

The fourth ground line 421 may be disposed at the center of the second metal foil layer 332.

The fourth ground line 421 and the first ground line 411 may have the same width. The fourth ground line 421 and the first ground line 411 may have the same extent. The fourth ground line 421 and the first ground line 411 may have line-symmetric shapes.

The fifth ground line 422 may be disposed to be spaced apart from the fourth ground line 421 by a predetermined length. The second insulation layer 332 may be disposed in the spacing area. Then, the second insulation layer 332 may contact the second metal foil insulation layer 331. The spacing area may correspond to the first fill-cut area 451.

The sixth ground line 423 may be disposed to be spaced apart from the fourth ground line 421 by a predetermined length. The second insulation layer 332 may be disposed in the spacing area. Then, the second insulation layer 332 may contact the second metal foil insulation layer 331. The spacing area may correspond to the second fill-cut area 452.

The fourth ground line 421 may be disposed at the center of the second metal foil layer 332, and the fifth ground line 422 and the sixth ground line 423 may be disposed to be spaced apart from opposite sides of the fourth ground line 421.

The fifth ground line 422 and the second ground line 412 may have the same width. The fifth ground line 422 and the second ground line 412 may have the same extent. The fifth ground line 422 and the second ground line 412 may have line-symmetric shapes.

The sixth ground line 423 and the third ground line 413 may have the same width. The sixth ground line 423 and the third ground line 413 may have the same extent. The sixth ground line 423 and the third ground line 413 may have line-symmetric shapes.

The fourth ground line 421 and the fifth ground line 422 may be spaced apart from each other by the first fill-cut area 451.

The fourth ground line 421 and the sixth ground line 423 may be spaced apart from each other by the second fill-cut area 452.

The first fill-cut area 451 and the second fill-cut area 452 may be areas obtained by removing a metal foil from at least a partial area of the second metal foil layer 332 or formed by separate disposition of lines 411-415, 421-423.

The second metal foil insulation layer 331 may constitute at least a portion of the second metal foil clad laminate 382, and may include a material having an insulation property.

Figure 5:
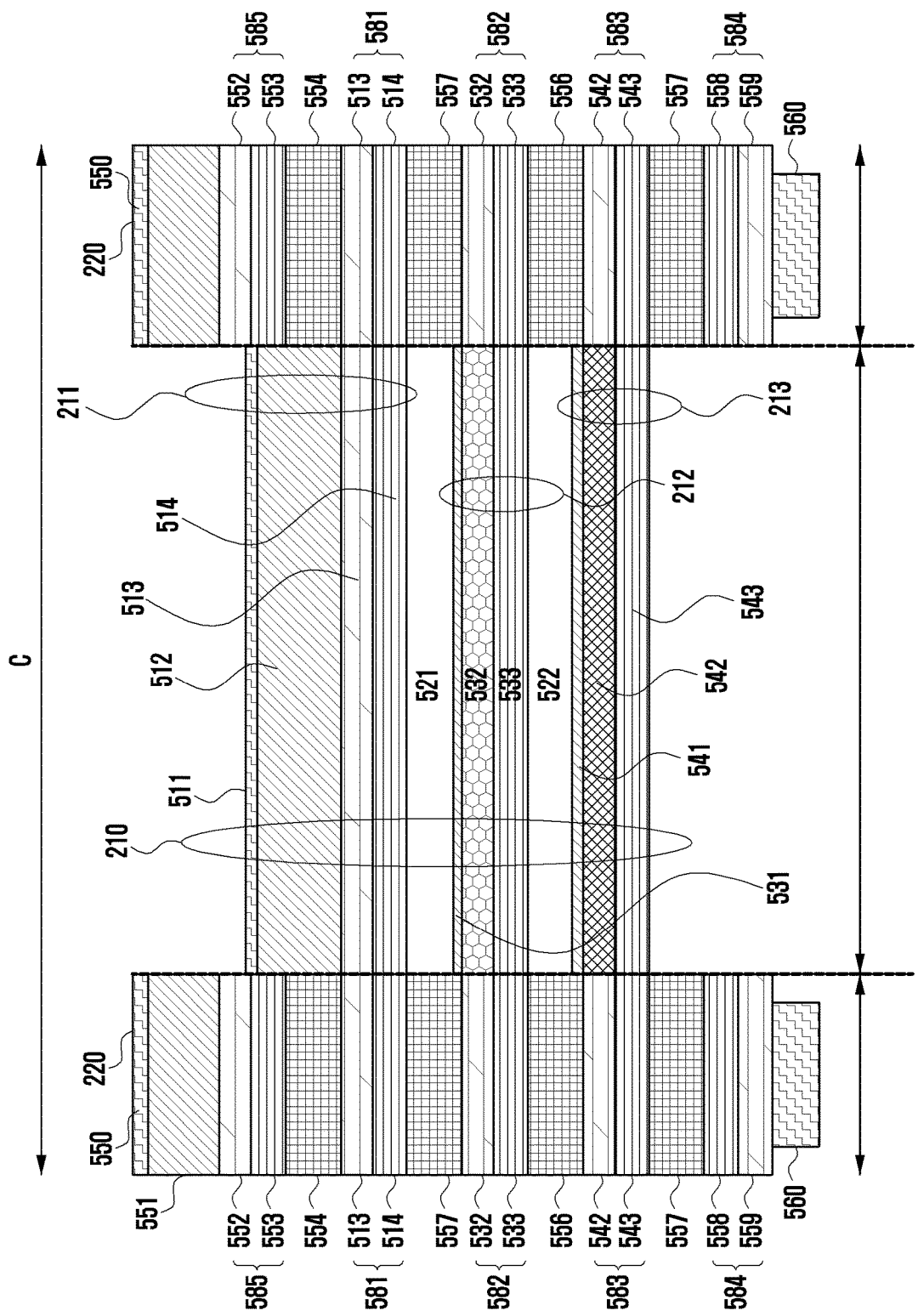
FIG. 5 is a cross-sectional view of the flexible cable of FIG. 2 of the disclosure, taken along in a lengthwise direction C thereof.

FIG. 5 is a cross-sectional view of the cable 200 of FIG. 2 of the disclosure, taken along in a lengthwise direction C thereof. The flexible cable portion 210 may include a first wire 211, a second wire 212, and a third wire 213. The flexible cable portion 210 may further include a first air gap 521 between the first wire 211 and the second wire 212. The flexible cable portion 210 may further include a second air gap 522 between the second wire 212 and the fifth cable 213.

The apertures of the first air gap 521 between the first wire 211 and the second wire 212 and/or the second air gap 522 between the second wire 212 and the third wire 213 may be changed when the first wire 211, the second wire 212, and the third wire 213 move such that the aperture is changed. Even when the apertures of the first air gap 521 and/or the second air gap 522 are changed, the impedance matching of the flexible cable 200, the flexible cable portion 210, the first wire 211, the second wire 212 and the third wire 213 is maintained and signal loss and reflection thereof are low. Even when the apertures of the first air gap 521 and/or the second air gap 522 are changed, the impedance matching of the flexible cable 200, the flexible cable portion 210, the first wire 211, the second wire 212 and the third wire 213 may be maintained and signal loss and reflection thereof may be constantly maintained.

The first wire 211 may include a first shield layer 511, a first insulation layer 512, and a first metal foil clad laminate 581.

The first shield layer 511 may be a film that may shield electron magnetic interferences (EMIs). For example, the first shield layer 511 may include an electron magnetic interference (EMI) shielding film. For example, the first shield layer 511 may include polyester or polyimide. The first shield layer 511 may be provided on a surface of the third wire 311, and the first shield layer 511 may provide a ground to the first metal foil layer 513. The first insulation layer 512 may include a material having an insulation property. The first insulation layer 512 may include a dielectric. The first insulation layer 512 may include a cover layer. The first insulation layer 512 may protect and insulate an exposed surface of a circuit of the first metal foil clad laminate 581. The first insulation layer 512 may be disposed between the first shield layer 511 and the first metal foil layer 513. The first insulation layer 512 may be disposed between the first shield layer 511 and the first metal foil clad laminate 581.

The first metal foil clad laminate 581 may include a first metal foil layer 513 and a first metal foil insulation layer 514. The first metal foil layer 513 may include at least one or more signal transmission lines and at least one or more ground lines. The first metal foil clad laminate 581, for example, may include a copper clad laminate (CCL). The first metal foil clad laminate 581 may be a structure in which a metal foil (e.g., a copper foil) is disposed on one surface thereof and an insulation layer is disposed and laminated on a second surface thereof. The first metal foil clad laminate 581 may be disposed under the first insulation layer 512, and may be disposed between the first insulation layer 512 and the first air gap 521.

The first metal foil layer 513 may be disposed between the first insulation layer 512 and the first metal foil insulation layer 514. The first metal foil layer 513 may be configured to include at least one or more signal transmission lines and at least one or more ground lines by etching or machining (e.g., numerical-control machining) at least a portion of the first metal foil clad laminate 581.

The first metal foil insulation layer 514 may constitute at least a portion of the first metal foil clad laminate 581, and may include a material having an insulation property. The first metal foil insulation layer 514 may include a dielectric. The first metal foil insulation layer 514 may deliver a signal radiated from the first metal foil layer 513 to the second wire 212 or the third wire 213 through the first air gap 521.

The first shield layer 511, the first insulation layer 512, the first metal foil clad laminate 581 may be joined to each other through heating and/or pressing to form the first wire 211. For example, the first shield layer 511, the first insulation layer 512, and the first metal foil clad laminate 581 may be joined to each other by using a heat press.

The second wire 212 may include a second insulation layer 531 and a second metal foil clad laminate 582.

The second insulation layer 531 may include a material having an insulation property. The second insulation layer 531 may include a dielectric. The second insulation layer 531 may include a cover layer. The second insulation layer 531 may protect and insulate an exposed surface of a circuit of the second metal foil clad laminate 582. The second insulation layer 531 and the second metal foil insulation layer 533 may be exposed to the outside to protect the second metal foil layer 532 from the outside. The second insulation layer 531 may be disposed between the first air gap 521 and the second metal foil clad laminate 582.

The second metal foil clad laminate 582 may include a second metal foil layer 532 and a second metal foil insulation layer 533. The second metal foil layer 532 may include at least one or more fill-cut areas and at least one or more ground lines. The second metal foil clad laminate 582, for example, may include a copper clad laminate (CCL). The second metal foil clad laminate 582 may be a structure in which a metal foil (e.g., a copper foil) is disposed on one surface thereof and an insulation layer is disposed and laminated on a second surface thereof. The second metal foil clad laminate 582 may be disposed between the second insulation layer 531 and the second air gap 522.

The second metal foil layer 532 may be disposed between the second insulation layer 531 and the second metal foil insulation layer 533. The second metal foil layer 532 may be configured to include at least one or more signal transmission lines and at least one or more ground lines by etching or machining (e.g., numerical-control machining) at least a portion of the second metal foil clad laminate 582.

The second metal foil insulation layer 533 may constitute at least a portion of the second metal foil clad laminate 582, and may include a material having an insulation property. The second metal foil insulation layer 533 may include a dielectric. The second metal foil insulation layer 533 may deliver a signal radiated from the first metal foil layer 513 to the third metal foil layer 542.

The second metal foil insulation layer 533 may be disposed between the second metal foil layer 532 and the second air gap 522.

The second metal foil clad laminate 582 and the second insulation layer 531 may be joined to each other through heat and/or pressing to form the second wire 212. For example, the second metal foil clad laminate 582 and a second insulation layer 531 may be joined to each other by using a heat press.

The third wire 213 may include a third insulation layer 541 and a third metal foil clad laminate 583.

The third insulation layer 541 may include a material having an insulation property. The third insulation layer 541 may include a dielectric. The third insulation layer 541 may include a cover layer. The third insulation layer 541 may protect and insulate an exposed surface of a circuit of the third metal foil clad laminate 583. The third insulation layer 541 and the third metal foil insulation layer 543 may be exposed to the outside to protect the third metal foil layer 542 from the outside. The third insulation layer 541 may be disposed between the second air gap 522 and the third metal foil clad laminate 583.

The third metal foil clad laminate 583 may include a third metal foil layer 542 and a third metal foil insulation layer 543. The third metal foil layer 542 may include at least one ground line. The third metal foil layer 542 may include a metal pattern. The third metal foil layer 542 may include a mesh pattern, and the mesh pattern may be a pattern having a hole of a square shape, a circular shape, a rhombus shape, or the like.

The third metal foil clad laminate 583, for example, may include a copper clad laminate (CCL). The third metal foil clad laminate 583 may be a structure in which a metal foil (e.g., a copper foil) is disposed on one surface thereof and an insulation layer is disposed and laminated on a second surface thereof.

The third metal foil layer 542 may be disposed between the third insulation layer 541 and the third metal foil insulation layer 543. The third metal foil layer 542 may be configured to include at least one or more signal transmission lines and at least one or more ground lines by etching or machining (e.g., numerical-control machining) at least a portion of the third metal foil clad laminate 583.

The third metal foil insulation layer 543 may constitute at least a portion of the third metal foil clad laminate 583, and may include a material having an insulation property. The third metal foil insulation layer 543 may include a dielectric. The third metal foil insulation layer 543 may deliver a signal radiated from the first metal foil layer 513 to a ground.

The third metal foil clad laminate 583 and the third insulation layer 541 may be joined to each other through heat and/or pressing to form the third wire 213. For example, the third metal foil clad laminate 583 and a third insulation layer 541 may be joined to each other by using a heat press.

Opposite ends of the first metal foil clad laminate 581, the second metal foil laminate 582, and the third metal foil clad laminate 583 included in the flexible cable portion 210 may be continuously connected to the fourth cable 220.

The end cable portions 220 may be disposed at opposite ends of the flexible cable portion 210. The flexible cable portions 210 may include a second shield layer 550, a fourth insulation layer 551, a fourth metal foil clad laminate 585, a first coupling layer 554, a first metal foil clad laminate 581, a second coupling layer 555, a second metal foil clad laminate 582, a third coupling layer 556, a third metal foil clad laminate 583, a fourth coupling layer 557, and an fourth metal foil clad laminate 584, and a connector 360.

The first metal foil clad laminate 581, a second metal foil clad laminate 582, and a third metal foil clad laminate 583 of the end cable portions 220 may be continuously connected to the flexible cable portion 210. The first metal foil clad laminate 581, the second metal foil clad laminate 582, and the third metal foil clad laminate 583 of the end cable portions 220 may be the same as the first metal foil clad laminate 581, the second metal foil clad laminate 582, and the third metal foil clad laminate 583 of the flexible cable portion 210.

The second shield layer 550 may be a film that may shield electron magnetic interferences (EMIs). For example, the second shield layer 550 may include an electron magnetic interference (EMI) shielding film. For example, the second shield layer 550 may include polyester or polyimide. The second shield layer 550 may be provided on a surface of the end cable portions 220. The second shield layer 550 may be provided at a lower portion of the fourth insulation layer 551.

The fourth insulation layer 551 may include a material having an insulation property. The fourth insulation layer 551 may include a dielectric. The fourth insulation layer 551 may include a cover layer. The fourth insulation layer 551 may protect and insulate an exposed surface of a circuit of the fourth metal foil clad laminate 585. The fourth insulation layer 551 may be disposed between the second shield layer 550 and the fourth metal foil layer 552. The fourth insulation layer 551 may be disposed between the fourth insulation layer 551 and the fourth metal foil laminate 585.

The fourth metal foil clad laminate 585 may include a fourth metal foil layer 552 and a fourth metal foil insulation layer 553. The fourth metal foil layer 552 may include at least one or more signal transmission lines and/or at least one or more ground lines. The fourth metal foil clad laminate 585, for example, may include a copper clad laminate (CCL). The fourth metal foil clad laminate 585 may be a structure in which a metal foil (e.g., a copper foil) is disposed on one surface thereof and an insulation layer is disposed and laminated on a second surface thereof. The fourth metal foil layer 552 may be disposed between the fourth insulation layer 551 and the fourth metal foil insulation layer 553. The fourth metal foil layer 552 may be configured to include at least one or more signal transmission lines and/or at least one or more ground lines by etching or machining (e.g., numerical-control machining) at least a portion of the fourth metal foil clad laminate 585.

The first coupling layer 554 may be disposed between the fourth metal foil clad laminate 585 and the first metal foil clad laminate 581.

The first metal foil clad laminate 581 may be disposed between the first coupling layer 554 and the second coupling layer 555.

The second coupling layer 555 may be disposed between the first metal foil clad laminate 581 and the second metal foil clad laminate 582.

The second metal foil clad laminate 582 may be disposed between the second coupling layer 555 and the third coupling layer 556.

The third coupling layer 556 may be disposed between the second metal foil clad laminate 582 and the third metal foil clad laminate 583.

The third metal foil clad laminate 583 may be disposed between the third coupling layer 556 and the fourth coupling layer 557.

The fourth coupling layer 557 may be disposed between the third metal foil clad laminate 583 and the fourth metal foil clad laminate 584.

The fourth metal foil clad laminate 584 may be disposed between the fourth coupling layer 557 and the connector 560.

The fourth metal foil clad laminate 584 may include an fifth metal foil insulation layer 558 and an fifth metal foil layer 559. The fifth metal foil layer 559 may include at least one or more signal transmission lines and/or at least one or more ground lines. The fourth metal foil clad laminate 584, for example, may include a copper clad laminate (CCL). The fourth metal foil clad laminate 584 may be a structure in which a metal foil (e.g., a copper foil) is disposed on one surface thereof and an insulation layer is disposed and laminated on a second surface thereof.

The fifth metal foil insulation layer 558 may be disposed between the fifth metal foil layer 559 and the fourth coupling layer 557, and the fifth metal foil layer 559 may be disposed between the fifth metal foil insulation layer 558 and the connector 560.

The first coupling layer 554, the second coupling layer 555, the third coupling layer 556, and the fourth coupling layer 557 may include a prepreg (pre-impregnated material) or a bonding sheet.

The first coupling layer 554, the second coupling layer 555, the third coupling layer 556, and the fourth coupling layer 557 may include an insulation material. The first coupling layer 554, the second coupling layer 555, the third coupling layer 556, and the fourth coupling layer 557 may shield a signal transmission line (the signal transmission line 614 or the second signal transmission line 615 of FIG. 6) included in the first metal foil clad laminate 581. When a signal is transmitted via the first foil clad laminate 581, the first coupling layer 554, the second coupling layer 555, the third coupling layer 556, and the fourth coupling layer 557 may shield the first metal foil clad laminate 581 to reduce signal loss and reflection of the first metal foil clad laminate 581.

The connector 560 may be disposed under the fourth metal foil clad laminate 584. The connector 560 may be coupled to the fifth metal foil layer 559 to provide a ground.

The connector 560 may be coupled to a ground to provide a ground voltage to the cable 200.

FIG. 6 is a cross-sectional view of a flexible cable portion 210 of FIG. 2 of the disclosure, taken along in a transverse direction D thereof.

The flexible cable portion 210 may include a first wire 211, a second wire 212, and a third wire 213. The flexible cable portion 210 may further include a first air gap 521 between the first wire 211 and the second wire 212. The flexible cable portion 210 may further include a second air gap 522 between the second wire 212 and the third wire 213.

The first wire 211 may include a first shield layer 511, a first insulation layer 512, and a first metal foil clad laminate 581.

The first metal foil layer 513 may be disposed between the first insulation layer 512 and the first metal foil insulation layer 514. The first metal foil layer 513 may include at least one or more signal transmission lines 614 and 615 and at least one or more ground lines 611, 612, and 613.

The first metal foil layer 513 may include a first signal transmission line 614 and a second signal transmission line 615, a first ground line 611, an second ground line 612, and a third ground line 613.

The first insulation layer 512 may be disposed on the first metal foil layer 513 in which the first signal transmission line 614 and the second signal transmission line 615, the first ground line 611 second ground line 612 first-third ground lines 613-615 are disposed, and may protect and insulate the first and second signal transmission lines 614, 615, and the first, second, and third ground lines second ground line 612 third ground line 613, 611-613.

The first ground line 611 may be disposed at the center of the first metal foil layer 513. The first signal transmission line 614 and the second signal transmission line 615 may be disposed to be spaced apart from the first ground line 611 by a predetermined length.

The first signal transmission line 614 and the second signal transmission line 615 may be disposed on opposite sides while being spaced apart from the first ground line 611 by a predetermined length.

The second ground line 612 may be disposed to be spaced apart from the first signal transmission line 614 by a predetermined length. The first insulation layer 512 may be disposed in the spacing area. Then, the first insulation layer 512 may contact the first metal foil insulation layer 514.

The third ground line 613 may be disposed to be spaced apart from the second signal transmission line 615 by a predetermined length. The first insulation layer 512 may be disposed in the spacing area. Then, the first insulation layer 512 may contact the first metal foil insulation layer 514.

The first ground line 611 may be disposed at the center of the first metal foil layer 513, the first signal transmission line 614 and the second signal transmission line 615 may be disposed to be spaced apart from each other on opposite sides of the first ground line 611, and the second ground line 612 and the third ground line 613 may be disposed on sides that are close to the second signal transmission line 615 and the first signal transmission line 614 and/or on sides that are farthest from the first ground line 611.

The first ground line 611 and the second ground line 612 may be spaced apart from each other to correspond to the first fill-cut area 651.

The first ground line 611 and the third ground line 613 may be spaced apart from each other to correspond to the second fill-cut area 652.

The first fill-cut area 651 and the second fill-cut area 652 may be areas obtained by removing a metal foil from at least a partial area of the second metal foil layer 532.

The first signal transmission line 614 may be disposed at at least a portion of the area in which the first ground line 611 and the second ground line 612 are spaced apart from each other to correspond to the first fill-cut area 651 to be spaced apart from the first ground line 611 and the second ground line 612 by a predetermined distance. The first insulation layer 512 may be disposed in the spacing area. Then, the first insulation layer 512 may contact the first metal foil insulation layer 514.

The first signal transmission line 615 may be disposed at at least a portion of the area in which the first ground line 611 and the third ground line 613 are spaced apart from each other to correspond to the fourth fill-cut area 652 to be spaced apart from the first ground line 611 and the third ground line 613 by a predetermined distance. The first insulation layer 512 may be disposed in the spacing area. Then, the first insulation layer 512 may contact the first metal foil insulation layer 514.

The second wire 212 may include a second insulation layer 531 and a second metal foil clad laminate 582. The second metal foil clad laminate 582 may include a second metal foil layer 532 and a second metal foil insulation layer 533. The second metal foil layer 532 may include at least one or more fill-cut areas 651 and 652 and at least one or more ground lines 621, 622, and 623.

The second metal foil layer 532 may include a fourth ground line 621, an eleventh ground line 622, and a sixth ground line 623.

The second insulation layer 531 may be disposed on the second metal foil layer 532, on which the fourth ground line 621, the fifth ground line 622, and the sixth ground line 623 are disposed, and may protect and insulate the fourth ground line 621, the fifth ground line 622, and the sixth ground line 623.

The fourth ground line 621 may be disposed at the center of the second metal foil layer 532.

The fourth ground line 621 and the first ground line 611 may have the same width. The fourth ground line 621 and the first ground line 611 may have the same extent. The fourth ground line 621 and the first ground line 611 may have line-symmetric shapes.

The fifth ground line 622 may be disposed to be spaced apart from the fourth ground line 621 by a predetermined length. The second insulation layer 531 may be disposed in the spacing area. Then, the second insulation layer 531 may contact the second metal foil insulation layer 533. The spacing area may correspond to the third fill-cut area 651.

The sixth ground line 623 may be disposed to be spaced apart from the fourth ground line 621 by a predetermined length. The second insulation layer 531 may be disposed in the spacing area. Then, the second insulation layer 531 may contact the second metal foil insulation layer 533. The spacing area may correspond to the fourth fill-cut area 652.

The fourth ground line 621 may be disposed at the center of the second metal foil layer 532, and the fifth ground line 622 and the sixth ground line 623 may be disposed to be spaced apart from opposite sides of the fourth ground line 621.

The fifth ground line 622 and the second ground line 612 may have the same width. The fifth ground line 622 and the second ground line 612 may have the same extent. The fifth ground line 622 and the second ground line 612 may have line-symmetrical shapes.

The sixth ground line 623 and the third ground line 613 may have the same width. The sixth ground line 623 and the third ground line 613 may have the same extent. The sixth ground line 623 and the third ground line 613 may have line-symmetric shapes.

The fourth ground line 621 and the fifth ground line 622 may be spaced apart from each other by the third fill-cut area 651.

The fourth ground line 621 and the sixth ground line 623 may be spaced apart from each other by the second fill-cut area 652.

The first fill-cut area 651 and the second fill-cut area 652 may be areas obtained by removing a metal foil from at least a partial area of the second metal foil layer 532.

The second metal foil insulation layer 533 may constitute at least a portion of the second metal foil clad laminate 582, and may include a material having an insulation property.

The fourth wire 213 may include a third insulation layer 541 and a third metal foil clad laminate 583.

The third metal foil clad laminate 583 may include a third metal foil layer 542 and a third metal foil insulation layer 543. The third metal foil layer 542 may include at least one ground line. The third metal foil layer 542 may include a metal pattern. The third metal foil layer 542 may include a mesh pattern, and the mesh pattern may be a pattern having a hole of a square shape, a circular shape, a rhombus shape, or the like.

Figure 7A:
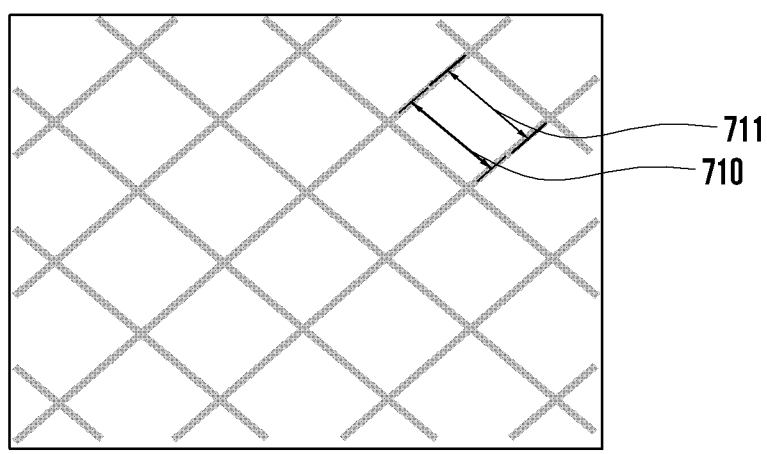
FIG. 7A is a view illustrating a metal pattern of a sixth metal foil layer.
Figure 7B:
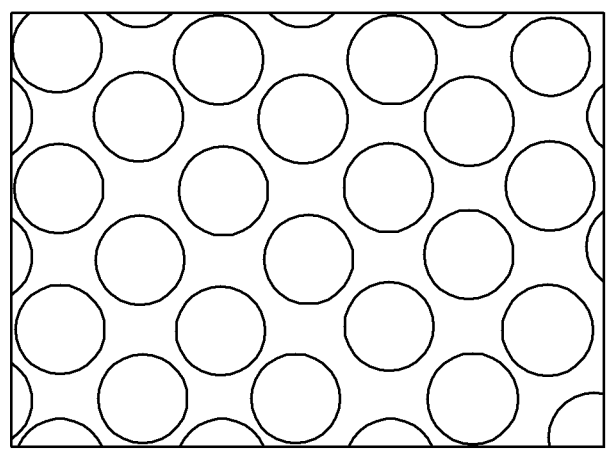
FIG. 7B is a view illustrating a metal pattern of a sixth metal foil layer.

FIG. 7A is a view illustrating a metal pattern of a third metal foil layer 642, and FIG. 7B is a view illustrating a metal pattern of a third metal foil layer 642. The third metal foil layer 542 may include a mesh pattern, and the mesh pattern may be a pattern having a hole of a square shape, a circular shape, and a rhombus shape.

The mesh pattern of FIG. 7A is a pattern including a square shape, a rhombus shape, or a tetragonal shape, and the mesh pattern of FIG. 7B is a circular pattern.

Figure 8:
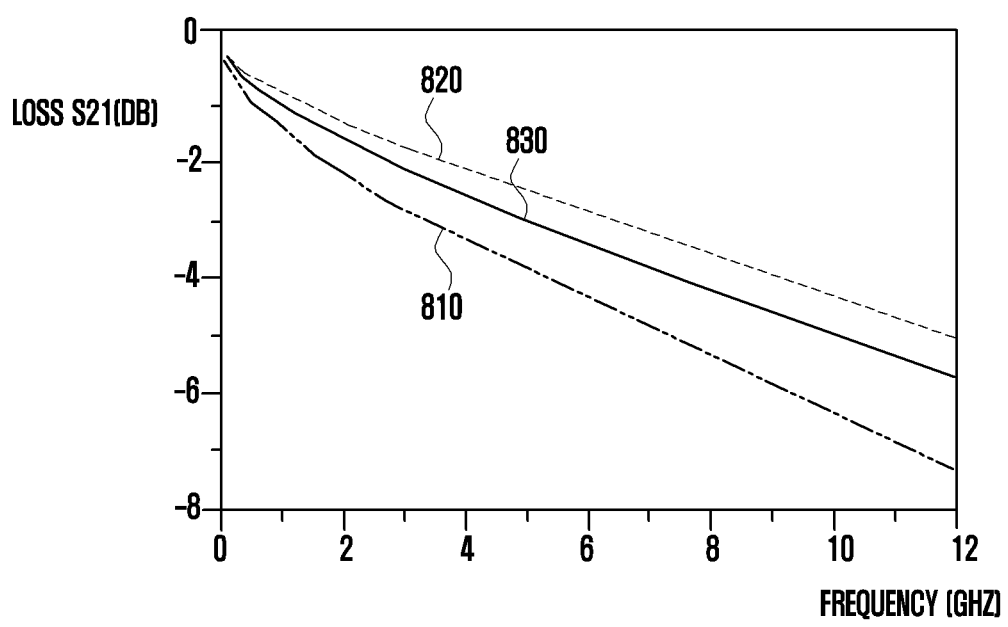
FIG. 8 is a graph illustrating loss and reflection according to a line width of the sixth metal foil layer.

FIG. 8 is a graph illustrating loss and reflection according to a line width of the third metal foil layer 642. Referring to FIGS. 7A, 7B, and 8, a first loss rate 810 denotes a case with no pattern. A second loss rate 820 denotes a case in which the metal pattern has a first line width 710, and a third loss rate 830 denotes a case in which the metal pattern has a second line width 711. The signal loss rate is lower when there is a metal pattern 820 or 830 than there is no pattern. The loss rate may vary according to the line width of the pattern.

Although the disclosure has been described above by way of certain embodiments, it will be apparent to those skilled in the art that changes and modifications fall within the scope of the disclosure without departing from the technical idea of the disclosure.

What is claimed is:

1. A cable comprising: a flexible cable portion; and
an end cable portion connected to one end of the flexible cable portion,
wherein the flexible cable portion comprises:
a first wire including one or more signal transmission lines and one or more ground lines disposed on a first metal foil insulation layer; and
a second wire including a metal foil separate from the one or more ground lines, and
one or more fill-cut areas in which portions of the metal foil are removed at locations corresponding to the one or more signal transmission lines and at least one or more ground lines,
wherein the one or more signal transmission lines are surrounding by the first metal foil insulation layer and a first insulation layer;
wherein an air gap is defined between the first wire and the second wire, such that the one or more fill-cut areas are separated from the one or more signal transmission lines by at least the air gap, wherein the first metal foil insulation layer is disposed between the one or more signal transmission lines and the air gap.

2. The flexible cable of claim 1, wherein the first wire further comprises:
a first shield layer; and
a first metal foil clad laminate comprising the one or more signal transmission lines.

3. The flexible cable of claim 2, wherein the first metal foil clad laminate comprises:
a first metal foil layer comprising the one or more signal transmission lines; and
the first metal foil insulation layer.

4. The flexible cable of claim 3, wherein the first metal foil layer is disposed between the first insulation layer and the first metal foil insulation layer.

5. The flexible cable of claim 3, wherein the first metal foil layer comprises the one or more ground lines.

6. The flexible cable of claim 3, wherein a first ground line is located at a center in a transverse direction of the first metal foil layer, and a second ground line and a third ground line are disposed on opposite sides of the first ground line to be spaced apart from each other by a distance corresponding to the one or more fill-cut areas.

7. The flexible cable of claim 6, wherein the first metal foil layer comprises:

a first signal transmission line disposed between the first ground line and the second ground line such that the first ground line and the second ground line are spaced apart from each other; and
a second signal transmission line disposed between the first ground line and the third ground line such that the first ground line and the third ground line are spaced apart from each other.

8. The flexible cable of claim 1, wherein the second wire comprises: a second metal foil clad laminate comprising the one or more fill-cut areas corresponding to the one or more signal transmission lines and the one or more ground lines; and a first insulation layer joined to the second metal foil clad laminate.

9. The flexible cable of claim 8, wherein the second metal foil clad laminate comprises: a second metal foil insulation layer disposed in a direction facing the first wire; and a second metal foil layer comprising the one or more fill-cut areas corresponding to the one or more signal transmission lines and the one or more ground lines of the first wire.

10. The flexible cable of claim 1, wherein the end cable portion comprises:
a shield layer;
a first metal foil clad laminate connected to the first wire and comprising the one or more signal transmission lines;
a second metal foil clad laminate connected to the second wire and comprising at least one or more fill-cut areas corresponding to the one or more signal transmission lines and the one or more ground lines of the first wire;
a third metal foil clad laminate;
a second insulation layer disposed between the shield layer and the third metal foil clad laminate;
a first bonding layer configured to laminate the first metal foil clad laminate and the third metal foil clad laminate;
a second bonding layer configured to laminate the first metal foil clad laminate and the second metal foil clad laminate; and
a connector connected to a metal foil of the second metal foil clad laminate.

11. The flexible cable of claim 10, wherein the first bonding layer and the second bonding layer are prepregs or bonding sheets.

12. The flexible cable of claim 10, further comprising a third wire comprising ground or a metal pattern.

13. The flexible cable of claim 12, wherein the metal pattern of the third wire has a mesh structure.

14. The flexible cable of claim 12, wherein the third wire comprises:
a fourth metal foil clad laminate comprising ground or the metal pattern; and
a third insulation layer configured to protect ground or the metal pattern.

15. The flexible cable of claim 14, wherein the end cable portion further comprises:
a first shield layer, a second shield layer and a third shield layer, the third shield layer configured to protect the second wire from the outside and shield electron magnetic wave interferences; and
a fifth metal foil clad laminate connected to the first wire and comprising the one or more signal transmission lines;
a sixth metal foil clad laminate connected to the second wire and comprising one or more fill-cut areas corresponding to the one or more signal transmission lines and the one or more ground lines of the first wire;
a seventh metal foil clad laminate;
an eighth metal foil clad laminate;
a fourth insulation layer disposed between the shield layer and the fifth metal foil clad laminate;
a third bonding layer configured to laminate the fifth metal foil clad laminate and the seventh metal foil clad laminate;
a fourth bonding layer configured to laminate the fifth metal foil clad laminate and the sixth metal foil clad laminate;
a fifth bonding layer configured to laminate the fourth metal foil clad laminate and the sixth metal foil clad laminate; and
a sixth bonding layer configured to laminate the eighth metal foil clad laminate and the fourth metal foil clad laminate; and
wherein the connector is connected to a metal foil of the eighth metal foil clad laminate.

16. The flexible cable of claim 15, wherein the third bonding layer, the fourth bonding layer, the fifth bonding layer, and the sixth bonding layer are prepregs or bonding sheets.

17. The flexible cable of claim 14, wherein the first wire comprises:
a first shield layer configured to protect the first wire from the outside and shield electron magnetic wave interferences;
the first metal foil clad laminate comprising the one or more signal transmission lines; and
the first insulation layer disposed between the shield layer and the first metal foil clad laminate.

18. The flexible cable of claim 17, wherein the first metal foil clad laminate comprises:
a first metal foil layer comprising the one or more signal transmission lines; and
the first metal foil insulation layer configured to insulate signal radiation of the first metal foil layer.

19. The flexible cable of claim 14, wherein the second wire comprises:
the second metal foil clad laminate comprising the one or more fill-cut areas corresponding to the one or more signal transmission lines and the one or more ground lines; and
a second insulation layer joined to the second metal foil clad laminate.

20. The flexible cable of claim 19, wherein the second metal foil clad laminate comprises:
a second metal foil insulation layer disposed in a direction facing the first wire; and
a second metal foil layer comprising the at least one or more fill-cut areas corresponding to the one or more signal transmission lines and the one or more ground lines.

21. A cable comprising:
a flexible cable portion; and
an end cable portion connected to one end of the flexible cable portion, wherein the flexible cable portion comprises:
a first wire including a plurality of signal transmission lines and one or more ground lines; and
a second wire including a metal foil separate from the one or more ground lines of the first wire, one or more ground lines, and a plurality of fill-cut areas in which portions of the metal foil are removed at locations corresponding to the plurality of signal transmission lines, and wherein the one or more ground lines are disposed at locations corresponding with the one or more ground lines of the first wire.

22. The cable of claim 21, wherein the flexible cable portion comprises a coaxial cable.

* * * * *